United States Patent
Loo et al.

(10) Patent No.: US 10,153,253 B2
(45) Date of Patent: Dec. 11, 2018

(54) PACKAGE-BOTTOM THROUGH-MOLD VIA INTERPOSERS FOR LAND-SIDE CONFIGURED DEVICES FOR SYSTEM-IN-PACKAGE APPARATUS

(71) Applicant: Intel Corporation, Santa Clara, CA (US)

(72) Inventors: Howe Yin Loo, Sungai Petani (MY); Eng Huat Goh, Penang (MY); Min Suet Lim, Simpang Ampat (MY); Bok Eng Cheah, Bukit Gambir (MY); Jackson Chung Peng Kong, Tanjung Tokong (MY); Khang Choong Yong, Puchong (MY)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 15/357,233

(22) Filed: Nov. 21, 2016

(65) Prior Publication Data

US 2018/0145051 A1   May 24, 2018

(51) Int. Cl.
    *H01L 25/065* (2006.01)
    *H01L 23/498* (2006.01)
    (Continued)

(52) U.S. Cl.
    CPC .... *H01L 25/0657* (2013.01); *H01L 23/49811* (2013.01); *H01L 25/0655* (2013.01); *H01L 25/16* (2013.01); *H01L 25/50* (2013.01); *H05K 1/111* (2013.01); *H05K 1/141* (2013.01); *H05K 3/30* (2013.01); *H05K 3/36* (2013.01); *H01L 2225/06513* (2013.01); *H01L 2225/06517* (2013.01); *H01L 2225/06541* (2013.01); *H05K 3/368* (2013.01); *H05K 2201/042* (2013.01); *H05K 2201/1003* (2013.01);
    (Continued)

(58) Field of Classification Search
    USPC .................................................. 361/760, 761
    See application file for complete search history.

(56) References Cited

U.S. PATENT DOCUMENTS

2004/0036169 A1   2/2004  Higuchi
2013/0127025 A1*  5/2013  Cho ...................... H01L 23/552
                                                                       257/660

(Continued)

FOREIGN PATENT DOCUMENTS

WO    WO-2018093539 A1    5/2018

OTHER PUBLICATIONS

"International Application Serial No. PCT/US2017/058053, International Search Report dated Jan. 30, 2018", 3 pgs.

(Continued)

*Primary Examiner* — Andargie M Aychillhum
(74) *Attorney, Agent, or Firm* — Schwegman Lundberg & Woessner, P.A.

(57) ABSTRACT

A system-in-package apparatus includes a package substrate configured to carry at least one semiconductive device on a die side and a through-mold via package bottom interposer disposed on the package substrate on a land side. A land side board mates with the through-mold via package bottom interposer, and enough vertical space is created by the through-mold via package bottom interposer to allow space for at least one device disposed on the package substrate on the land side.

19 Claims, 10 Drawing Sheets

(51) Int. Cl.
*H01L 25/16* (2006.01)
*H01L 25/00* (2006.01)
*H05K 1/11* (2006.01)
*H05K 3/30* (2006.01)
*H05K 3/36* (2006.01)
*H05K 1/14* (2006.01)

(52) U.S. Cl.
CPC .............. *H05K 2201/10015* (2013.01); *H05K 2201/10159* (2013.01); *H05K 2201/10378* (2013.01); *H05K 2201/10545* (2013.01); *H05K 2201/10734* (2013.01)

(56) References Cited

U.S. PATENT DOCUMENTS

| | | |
|---|---|---|
| 2013/0343022 A1 | 12/2013 | Hu et al. |
| 2015/0187608 A1* | 7/2015 | Ganesan ........... H01L 23/49811 257/738 |
| 2015/0287672 A1 | 10/2015 | Yazdani |
| 2016/0254249 A1 | 9/2016 | Jeng et al. |

OTHER PUBLICATIONS

"International Application Serial No. PCT/US2017/058053, Written Opinion dated Jan. 30, 2018", 9 pgs.

* cited by examiner

PACKAGE-BOTTOM THROUGH-MOLD VIA INTERPOSERS FOR LAND-SIDE CONFIGURED DEVICES FOR SYSTEM-IN-PACKAGE APPARATUS

FIELD

This disclosure relates to through-mold via package-bottom interposers for land-side configured devices that are part of system-in-package apparatus.

BACKGROUND

Package miniaturization poses device-integration challenges where both active and passive devices that are useful are to be placed close to e.g., a processor die.

BRIEF DESCRIPTION OF THE DRAWINGS

Embodiments of the invention are illustrated by way of example, and not by way of limitation, in the figures of the accompanying drawings where like reference numerals may refer to similar elements, in which.

DETAILED DESCRIPTION

Embodiments of the invention include through-mold via package-bottom interposers for land-side configured devices that are part of system-in-package apparatus.

Figure 1:
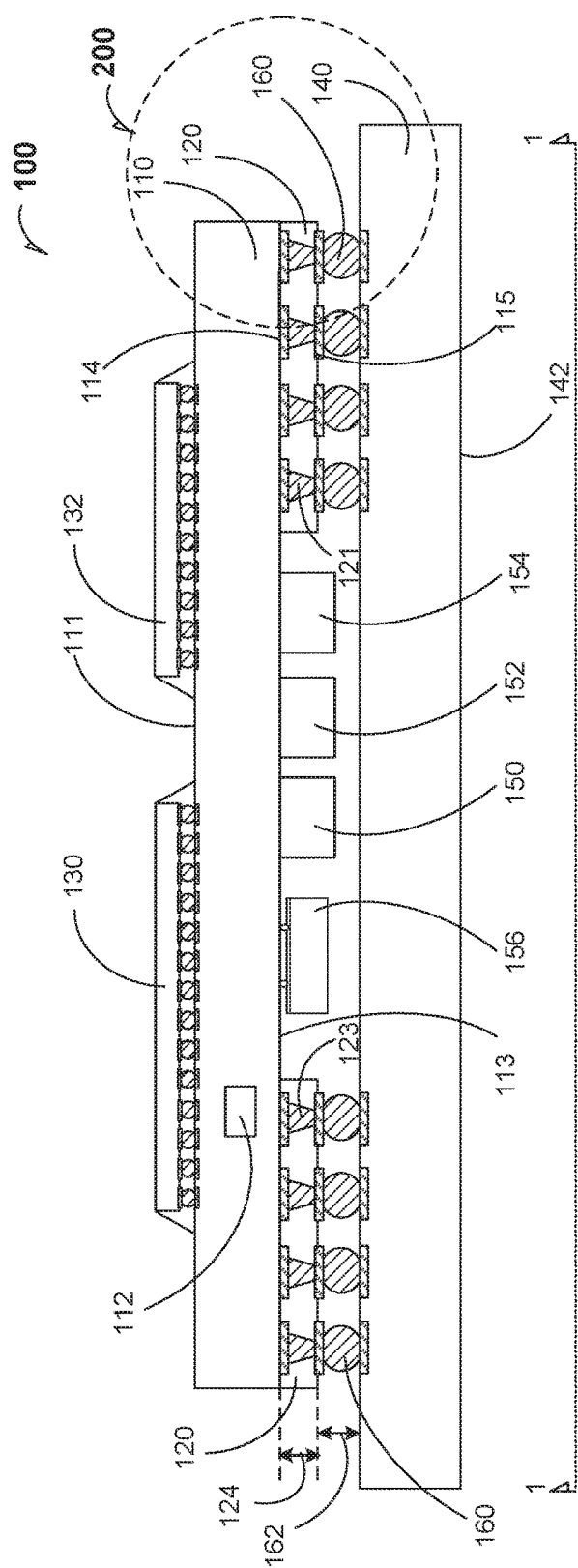
FIG. 1 is a cross-section elevation of a portion of a system-in package apparatus that includes a through-mold via package bottom interposer according to an embodiment.

FIG. 1 is a cross-section elevation of a portion of a system-in package apparatus 100 that includes a through-mold via package bottom interposer 120 according to an embodiment. A package substrate 110 is configured to carry at least one semiconductive device 130, 132 on a die side 111.

A through-mold via package bottom interposer 120 is disposed on the package substrate 110 on a land side 113 and the through-mold via package bottom interposer 120 includes at least one through-mold via 121, 123. The through-mold via 121 is seen coupling to a land-side pad 114 that interfaces with the package substrate 110, as well as the through-mold via 121 couples to a board-side pad 115 and to a bump in a bump array, one of which is indicated with reference numeral 160. In an embodiment, the through-mold via 123 is seen in cross section covering a substantially vertical distance 124.

A land side board 140 is provided, onto which the through-mold via package bottom interposer 120 is mounted. In an embodiment, the land side board 140 is a motherboard such as for a computing system (see FIG. 10).

In an embodiment, at least one device 150, 152, 154 and 156 is disposed on the package substrate 110 on the land side 113, and the at least one through-mold via 121 couples the package substrate 110 and the land side board 140 through the package bottom interposer 120. The through-mold via 121, embedded in the through-mold via package bottom interposer 120, extends in the Z-direction as seen in FIG. 1. In an embodiment, the device 150 is a passive device such as an inductor. In an embodiment, the device 152 is a passive device such as a balun for a baseband processor. In an embodiment, the device 154 is a passive device such as an upset capacitor.

In an embodiment, an active device 156 is suspended from the land side 113. The active device 156 may be a baseband processor in an embodiment and the device 150 may be a balun that services the baseband processor 156. The active device 156 may be a memory die in an embodiment. In an embodiment, the active device 156 requires the additional Z-height provided by the through-mold via package bottom interposer 120.

In an embodiment, at least one fully integrated voltage regulator (FiVR) 112 is integrated in the package substrate 120. The FiVR 112 is depicted in simplified terms as a rectangular section within the package substrate 120. In an embodiment, the FiVR 112 is disposed below at least one semiconductive device 130 such as where the semiconductive device 130 is a processor. In an embodiment, the semiconductive device 130 is a processor such as that manufactured by Intel Corporation of Santa Clara, Calif.

In an embodiment, the FiVR is integrated in the package substrate and the FiVR 112 is disposed below the semiconductive device 130 as illustrated. In an embodiment, the FiVR may be disposed vertically from a promixate through-mold via 123 depending upon useful proximity of the circuitry of the FiVR to the semiconductive device 130, as well as useful proximity of the through-mold via 123 to the FiVR. In an embodiment, the FiVR may be disposed laterally away from the semiconductive device 130 depending upon useful proximity of the circuitry of the FiVR to the semiconductive device 130. For example in an embodiment, the FiVR 112 is located directly below circuitry in the semiconductive device 130 to facilitate voltage-regulation demand.

To couple the through-mold via package bottom interposer 120 to the land side board 140, a bump array is disposed there between, one bump of which is indicated with reference numeral 160. In an embodiment, the bump array 160 is disposed between the through-mold via package bottom interposer 120 and the land side board 140, the bump array 160 creates a first vertical distance 162 between the through-mold via package bottom interposer 120 and the land side board 140. Further, the through-mold via package bottom interposer 120 creates a second vertical distance 124 between the bump array 160 and the land side 113, and the second vertical distance 124 is greater than the first vertical distance 162.

Where the through-mold via package bottom interposer 120 creates sufficient Z-height between the package substrate 110 and the land side board 140 to facilitate the Z-profile of the at least one device 150, 152, 154 and 156, bump pitch for the bump array 160 may be small without compromising the useful space taken up in Z-profile by the at least one device 150, 152, 154 and 156. Although only four bond pads are depicted on each side of the bottom interposer 120 the number may be higher up to including about 80 bumps across instead of the illustrated four. Consequently, the bump pitch for the bump array 160 may be small without compromising the useful space taken up in Z-profile by the at least one device 150, 152 and 154 by virtue of the Z-height provided by the through-mold via package bottom interposer 120.

In an example embodiment, the bump array 160 is disposed between the through-mold via package bottom interposer 120 and the land side board 140, the bump array 160 creates the first vertical distance 162 between the through-mold via package bottom interposer 120 and the land side board 140, the through-mold via package bottom interposer 120 creates the second vertical distance 124 between the bump array and the land side 113, and the second vertical distance 124 is greater than the first vertical distance 162 that is quantified by the bump array 160 being spaced apart center-to-center with a third distance of least four bumps spacing that is less than the second distance 124. This may be understood where the up to 80 bumps may be used, but where the center-to-center distance between four adjacent and consecutive bumps is less than the second distance 124.

In an embodiment, the at least one semiconductive device 130, 132 includes a processor 130 and a platform-controller hub 132, the FiVR 112 is integrated in the package substrate 110, and it is disposed below the processor 130.

Figure 2:
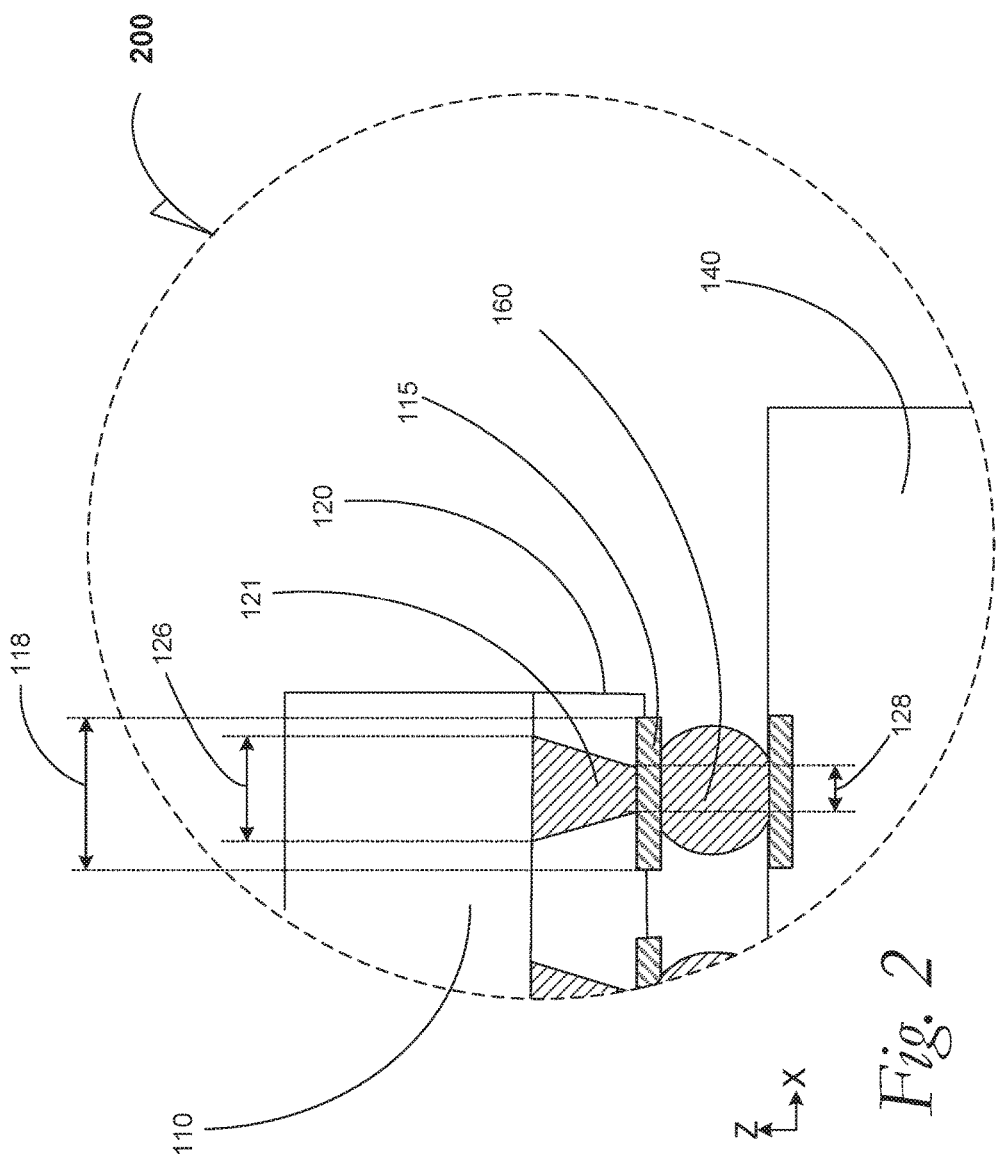
FIG. 2 is a detail section taken from FIG. 1 illustrating an embodiment.

FIG. 2 is a detail section taken from the section line 200 depicted in FIG. 1 according to an embodiment. In an embodiment, the through-mold via 121 has a frusto-conical shape. The through-mold via 121 has a wider dimension 126 toward the package substrate 110 and a narrower dimension 128 coupled to the board-side pad 115. This embodiment may be referred to as a padless via-top through-mold via 121. In this embodiment, the wider dimension 126 is a significantly large fraction of the width 118 of the board-side pad 115, such that no bond pad is needed at the wider dimension 126. Processing to achieve the wider dimension 126 and the narrower dimension 128 is done by milling a recess that will be filled by the through-mold via 121 with the frusto-conical form factor. Milling may be done by starting with a milling laser suited to penetrating the material of the through-mold via package bottom interposer 120. Where dimensions become small enough, an ultraviolet (UV) laser may be used. In any event, as penetration proceeds, the via recess narrows. In an embodiment, the wider dimension 126 of the padless via-top through-mold via 121 is in a range from 50 percent the width 118 of the board-side pad 115, to 95 percent.

It may now be understood that each illustrated embodiment depicted in FIGS. 1.3, 4, 5 and 6 may include a padless via-top through-mold via 121 as depicted in FIG. 2. Connection between the top of the padless via-top through-mold via 121 to the package substrate 110 without a bond pad or land-side pad 114, may be understood that the package substrate is "above and on" the padless through-mold via 121.

Figure 3:
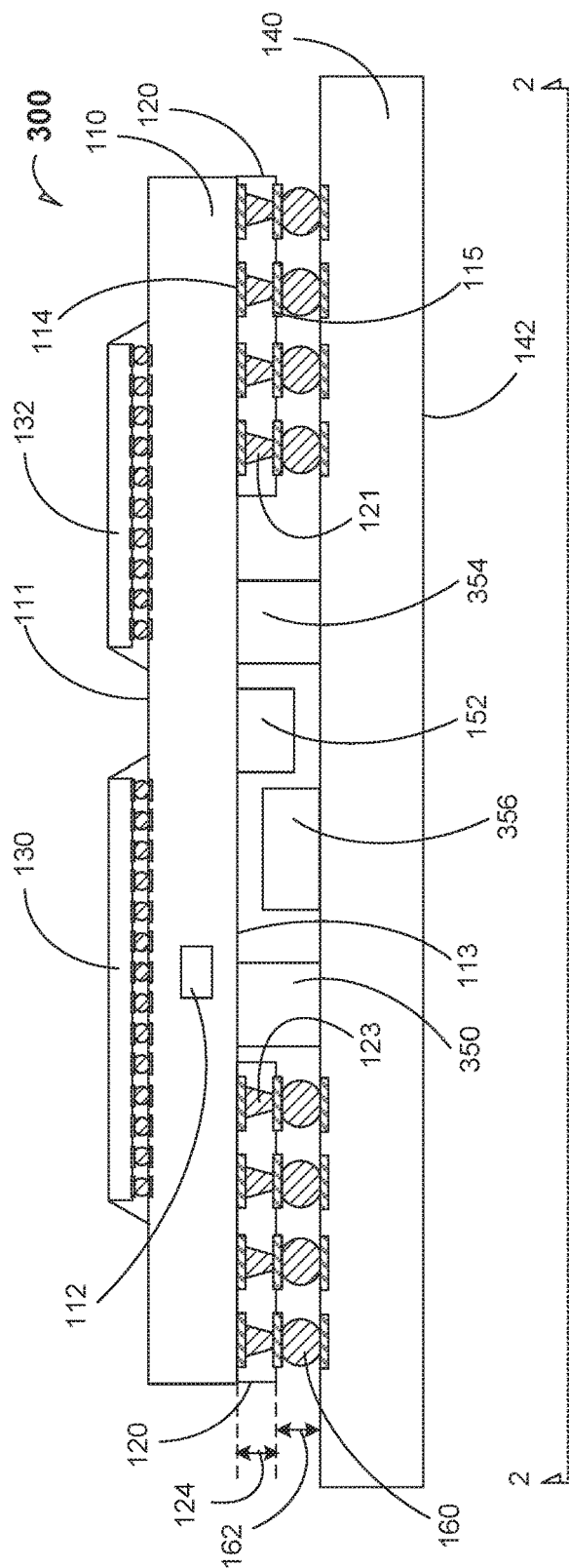
FIG. 3 is a cross-section elevation of a portion of a system-in package apparatus that includes a through-mold via package bottom interposer according to an embodiment.

FIG. 3 is a cross-section elevation of a system-in-package apparatus 300 according to an embodiment. A package substrate 110 is configured to carry at least one semiconductive device 130, 132 on a die side 111.

A through-mold via package bottom interposer 120 is disposed on the package substrate 110 on a land side 113 and the through-mold via package bottom interposer 120 includes at least one through-mold via 121, 123. The through-mold via 121 is seen coupling to a land-side pad 114 that interfaces with the package substrate 110, as well as the through-mold via 121 couples to a board-side pad 115 and to a bump in a bump array, one of which is indicated with reference numeral 160. In an embodiment, the through-mold via 123 is seen in cross section extending vertically.

A land side board 140 is provided, onto which the through-mold via package bottom interposer 120 is mounted. In an embodiment, the land side board 140 is a motherboard such as for a computing system (see FIG. 10).

In an embodiment, the system-in-package apparatus 300 includes at least one device 152 that is a suspended from the package substrate 110 and held above the land side board 140. In an embodiment, at least one landed device 350, 354 is disposed on the land side board 140. As illustrated, the landed devices 350, 354 create uniform-height spacers that facilitate using both the through-mold via package bottom interposer 120 and to help control the after-reflow bump height for the bump array 160.

In an embodiment, a device 356 is disposed on the land side board 140. In an embodiment, the device 356 is useful to be disposed on the land side board 140, a suspended device 152 is useful to be disposed on the land side 113 of the package substrate 110, but each device 356 and 152, or one of them, has a Z-profile that requires the package-bottom interposer 120.

Figure 4:
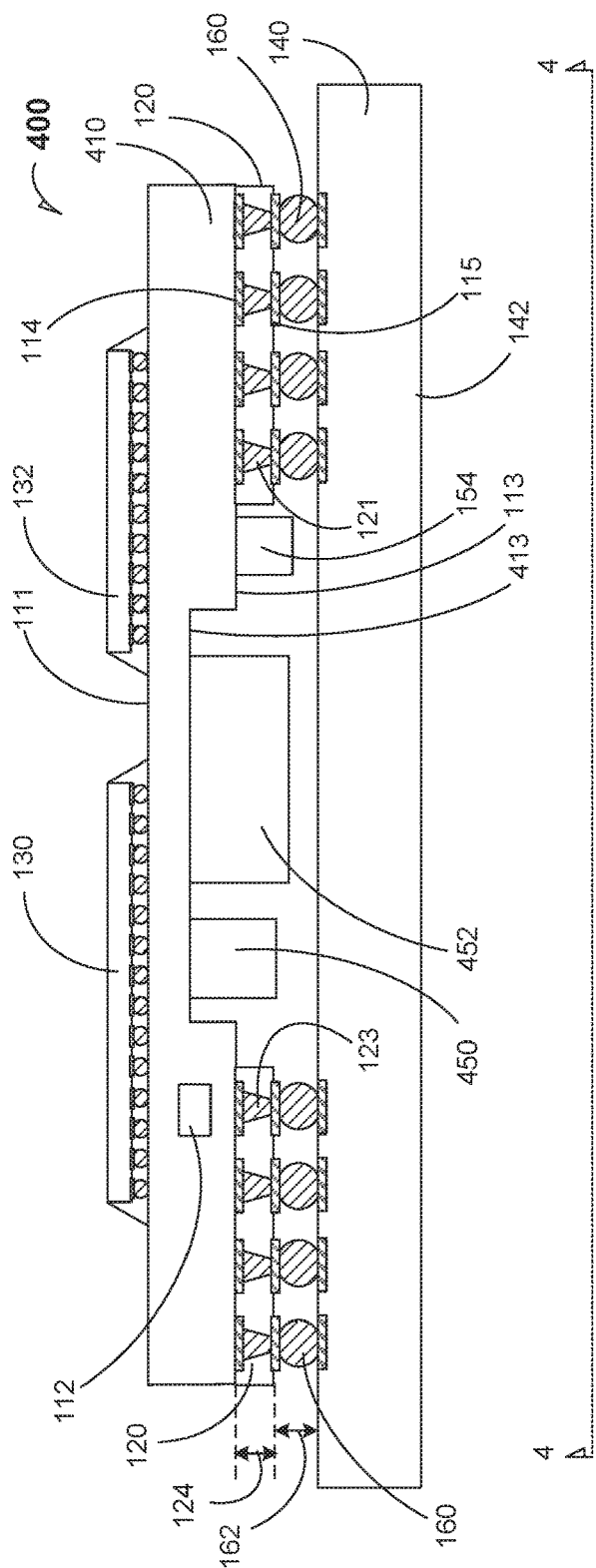
FIG. 4 is a cross-section elevation of a portion of a system-in package apparatus that includes a through-mold via package bottom interposer according to an embodiment.

FIG. 4 is a cross-section elevation of a portion of a system-in package apparatus 400 that includes a through-mold via package bottom interposer 120 according to an embodiment. A package substrate 410 is configured to carry at least one semiconductive device 130, 132 on a die side 111.

A through-mold via package bottom interposer 120 is disposed on the package substrate 410 on a land side 113 and the through-mold via package bottom interposer 120 includes at least one through-mold via 121, 123. The through-mold via 121 is seen coupling to a land-side pad 114 that interfaces with the package substrate 110, as well as the through-mold via 121 couples to a board-side pad 115 and to a bump in a bump array, one of which is indicated with reference numeral 160. In an embodiment, the through-mold via 123 is seen in cross section extending vertically.

A land side board 140 is provided, onto which the through-mold via package bottom interposer 120 is mounted. In an embodiment, the land side board 140 is a motherboard such as for a computing system (see FIG. 10).

In an embodiment, the package substrate 410 includes a recess 413 that opens the land side 113. At least one device 154 may be suspended from the land side 113, and the recess 413 may accommodate at least one device 450 such as a passive device. In an embodiment, the recess 413 may accommodate at least one active device 452 such as a memory device on the reverse package (MORP) 452. In the illustrated embodiment, the active device 452 is a baseband processor and the passive device 450 is a balun. In an embodiment, the baseband processor 452 has RF shielding, and it is connected to the balun 450 as well as through the package substrate 410 to a processor 130.

Figure 5:
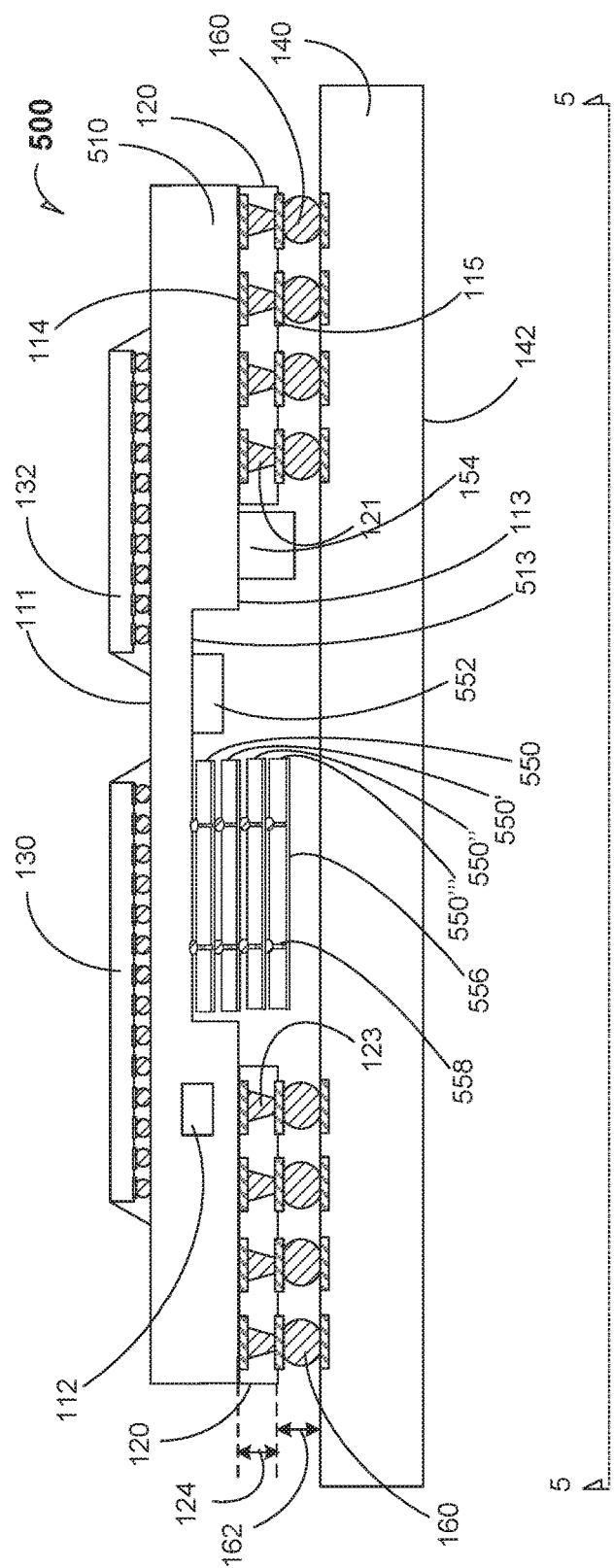
FIG. 5 is a cross-section elevation of a portion of a system-in package apparatus that includes a through-mold via package bottom interposer according to an embodiment.

FIG. 5 is a cross-section elevation of a portion of a system-in package apparatus 500 that includes a through-mold via package bottom interposer 120 according to an embodiment. A package substrate 510 is configured to carry at least one semiconductive device 130, 132 on a die side 111.

A through-mold via package bottom interposer 120 is disposed on the package substrate 510 on a land side 113 and the through-mold via package bottom interposer 120 includes at least one through-mold via 121, 123. The through-mold via 121 is seen coupling to a land-side pad 114 that interfaces with the package substrate 110, as well as the through-mold via 121 couples to a board-side pad 115 and to a bump in a bump array, one of which is indicated with reference numeral 160. In an embodiment, the through-mold via 123 is seen extending vertically.

A land side board 140 is provided, onto which the through-mold via package bottom interposer 120 is mounted. In an embodiment, the land side board 140 is a motherboard such as for a computing system (see FIG. 10).

In an embodiment, the package substrate 510 includes a recess 513 that opens the land side 113. At least one device 154 may be suspended from the land side 113, and the recess 513 may accommodate at least one device 552 such as a passive device. In the illustrated embodiment, the device 552 has a Z-profile that is small and the device 552 has a profile that is lower than the depth of the recess 513 as it does not intersect the level of the land side 113.

In an embodiment, the recess 513 may accommodate at least one active device 550 such as a stacked memory on the reverse package (SMORP). In the illustrated embodiment, the active device 550 is a memory die that includes a memory first die 550 and a memory subsequent die 550''' that is stacked with the memory die 550. The memory subsequent die 550''' extends downwardly in the Z-direction and is sufficiently low that the through-mold via package bottom interposer 120 creates a Z-height that is useful to prevent the memory subsequent die 550''' from impinging on the land side board 140. Each memory die includes an active surface and metallization 556 and a through-silicon via (TSV) 558 that facilitates communication to the package substrate 510. In an embodiment, the active device 550 is part of a SMORP that includes a memory first die 550, a memory second die 550' and a memory subsequent die 550'''. In an embodiment, the active device 550 is part of a SMORP that includes a memory first die 550, a memory second die 550', a memory third die 550'' and a memory subsequent die 550'''.

Figure 6:
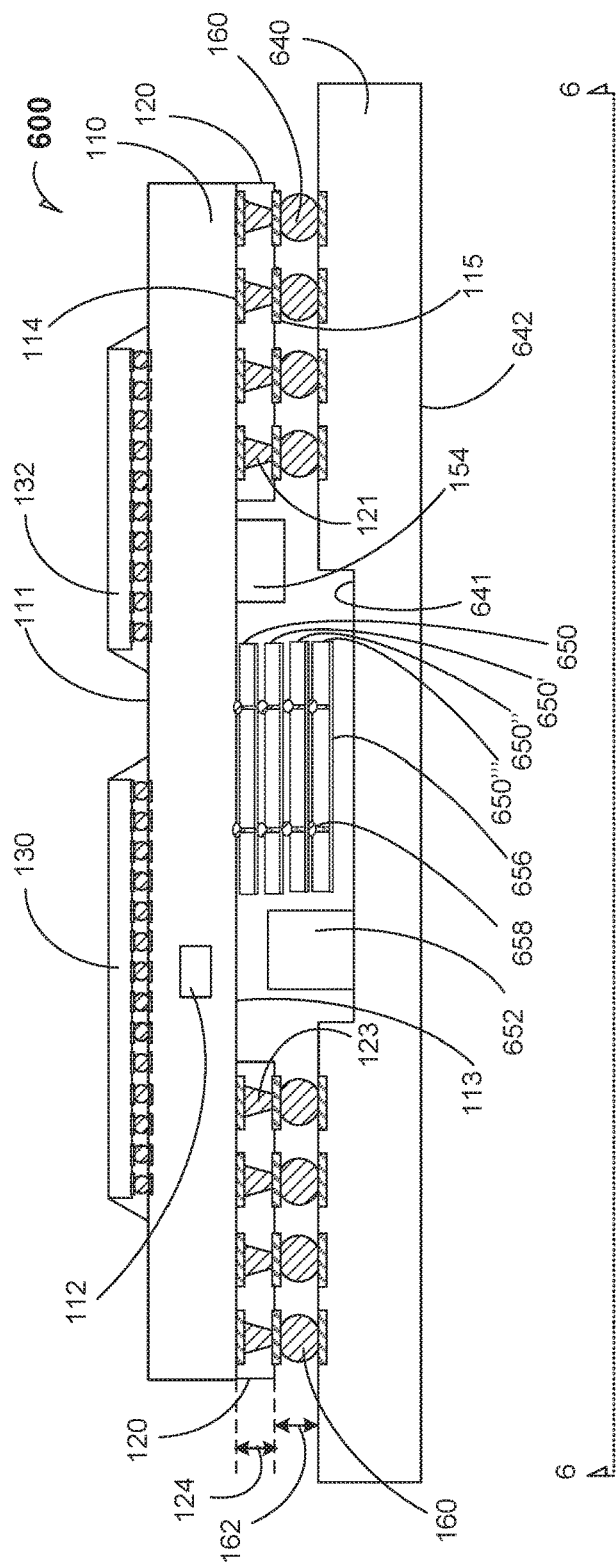
FIG. 6 is a cross-section elevation of a portion of a system-in package apparatus that includes a through-mold via package bottom interposer according to an embodiment.

FIG. 6 is a cross-section elevation of a portion of a system-in package apparatus 600 that includes a through-mold via package bottom interposer 120 according to an embodiment. A package substrate 110 is configured to carry at least one semiconductive device 130, 132 on a die side 111.

A through-mold via package bottom interposer 120 is disposed on the package substrate 110 on a land side 113 and the through-mold via package bottom interposer 120 includes at least one through-mold via 121, 123. The through-mold via 121 is seen coupling to a land-side pad 114 that interfaces with the package substrate 110, as well as the through-mold via 121 couples to a board-side pad 115 and to a bump in a bump array, one of which is indicated with reference numeral 160. In an embodiment, the through-mold via 123 is seen in cross section extending vertically.

A land side board 640 is provided, onto which the through-mold via package bottom interposer 120 is mounted. In an embodiment, the land side board 640 is a motherboard such as for a computing system (see FIG. 10).

In an embodiment, the land side board 640 includes a recess 641 that carries at least one passive device 652. At least one device 154 may be suspended from the land side 113. In an embodiment, the device 154 has a Z-profile that may be taller than the 120 through-mold via package bottom interposer 120. In an embodiment, the device 154 has a profile that is shorter than the through-mold via package bottom interposer 120.

In an embodiment, the recess 641 may accommodate at least one active device 650 that is suspended from the package substrate 110 such as a memory die that may be part of a stacked memory on the reverse package (SMORP). In the illustrated embodiment, the active device 650 is a memory die that includes a memory first die 650 and it is stacked with a memory subsequent die 650'''. The memory subsequent die 650''' extends downwardly in the Z-direction and is sufficiently low that the through-mold via package bottom interposer 120 creates a Z-height that is useful to prevent the memory subsequent die 650''' from impinging on the land side board 640. Each memory die includes an active surface and metallization 656 and a through-silicon via (TSV) 658 that facilitates communication to the package substrate 510. In an embodiment, the active device 650 is part of a SMORP that includes a memory first die 650, a memory second die 650' and a memory subsequent die 650'''. In an embodiment, the active device 650 is part of a SMORP that includes a memory first die 650, a memory second die 650', a memory third die 650'' and a memory subsequent die 650'''.

In any event, the bump array 160 is disposed between the through-mold via package bottom interposer 120 and the land side board 640 such that the recess 641 that opens the land side board 640 to a level below the bump array 160. In an embodiment, the bump array 160 is disposed between the through-mold via package bottom interposer 120 and the land side board 640 such that the recess 641 that opens the land side board 640 to a level below the bump array 160 and at least one device 652 is disposed in the recess 641, where the device 650 has a Z-profile that makes use of the added height of the through-mold via package bottom interposer 120.

Figure 7:
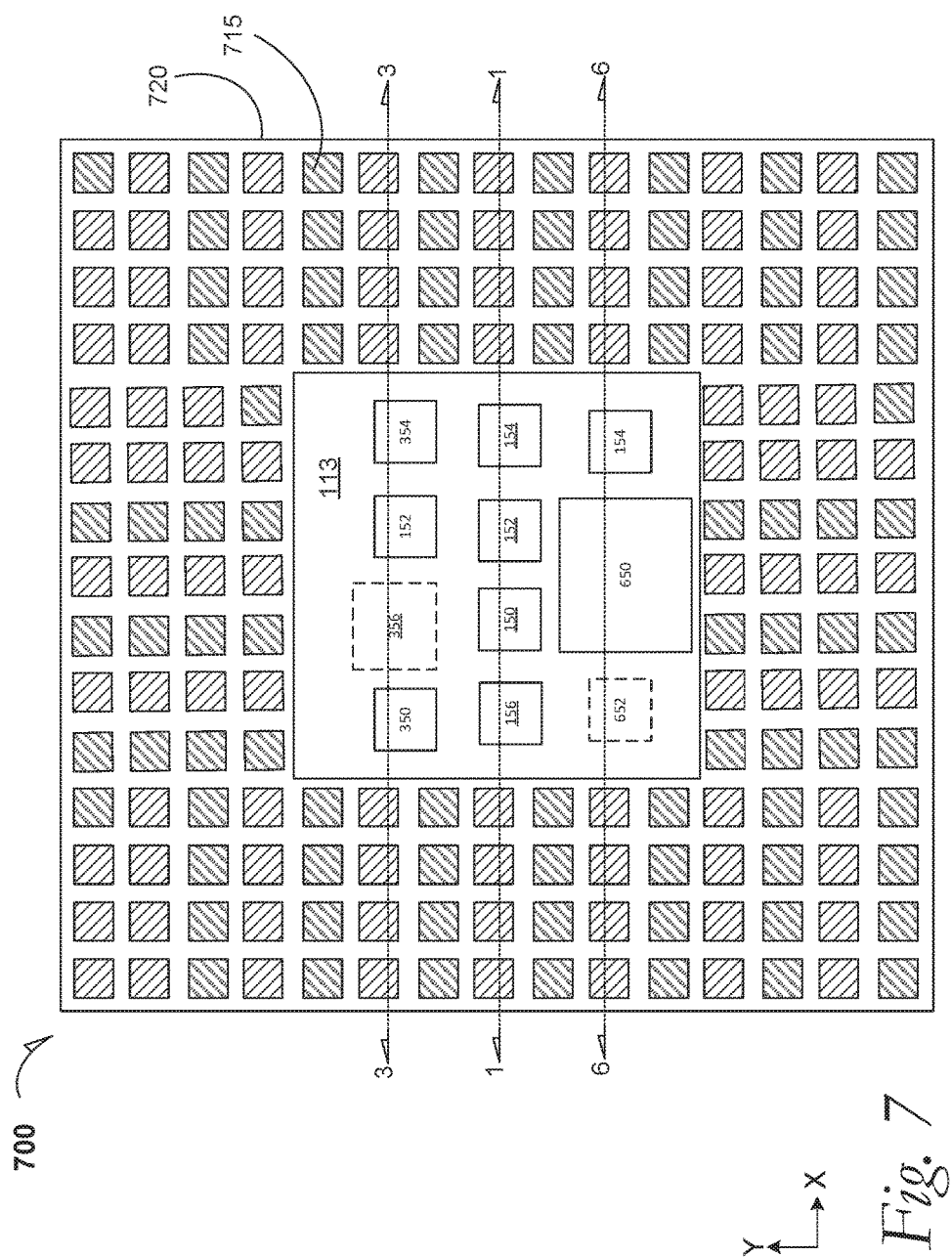
FIG. 7 is a bottom plan of a through-mold via package bottom interposer and an exposed package substrate according to an embodiment.

FIG. 7 is a bottom plan of a through-mold via package bottom interposer 720 and an exposed package substrate according to an embodiment. Several configurations are illustrated from FIGS. 1, 3 and 6. For example, the viewing line 1-1 points toward the through-mold via package bottom interposer 120 and package substrate 110 depicted in FIG. 1. Similarly, the viewing line 3-3 points toward the through-mold via package bottom interposer 120 and package substrate 110 depicted in FIG. 2. Additionally, the viewing line 6-6 points toward the through-mold via package bottom interposer 120 and package substrate 110 depicted in FIG. 6. The through-mold via package bottom interposer 120 exposes and infield portion of the package substrate (see, e.g. the package substrate 110 in FIG. 1).

In an embodiment, each device represented may be present, or a subset of what is illustrated may be present.

The through-mold via package bottom interposer 720 includes an array of bond pads, one of which is indicated by reference number 715. A device array is disposed on or below the land side 113 of the package substrate 110.

Referring to FIG. 1, it is observed that three passive devices 150, 152 and 154 are suspended from the infield of the through-mold via package bottom interposer on the land side 113 of the package substrate 110, and these devices are seen suspended therefrom. Referring to FIG. 3, it is observed that three passive devices 350, 152 and 354 are suspended from the infield of the through-mold via package bottom interposer on the land side 113 and package substrate 110, and a passive device 356 shows as a projection onto the land side 113. Referring to FIG. 6, it is observed that a passive device 154 is suspended from the infield of the through-mold via package bottom interposer 120 and from the package substrate 110 depicted on the land side 113, an active device 650 is also suspended from the land side 113, and a passive device 652 shows as a projection onto the land side 113.

Figure 8:
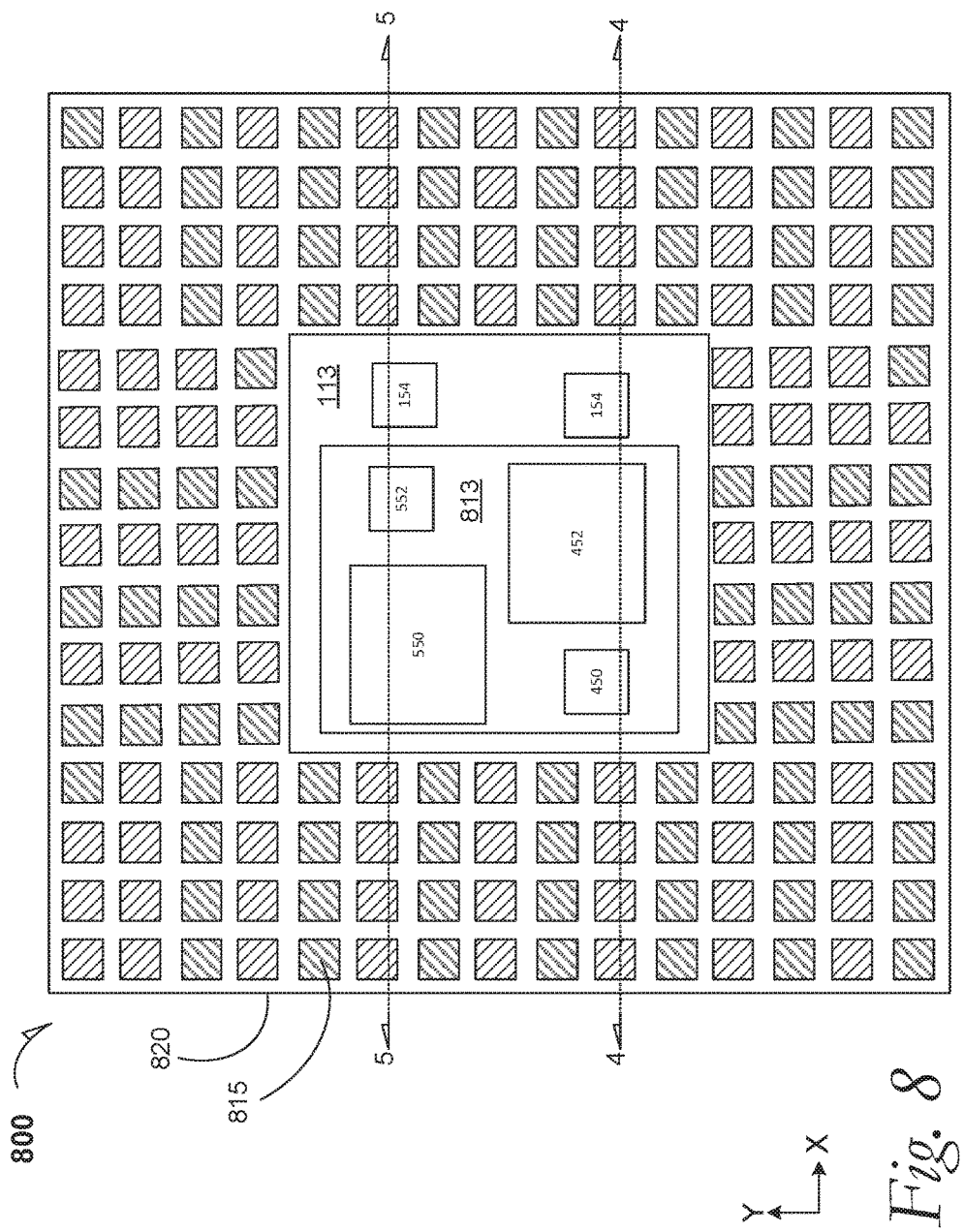
FIG. 8 is a bottom plan of a through-mold via package bottom interposer and an exposed package substrate according to an embodiment.

FIG. 8 is a bottom plan of a through-mold via package bottom interposer 820 and an exposed package substrate according to an embodiment. Several configurations are illustrated from FIGS. 4 and 5. For example, the viewing line 4-4 points toward the through-mold via package bottom interposer 120 and the exposed package substrate 410 in FIG. 4. Similarly, the viewing line 5-5 points toward the through-mold via package bottom interposer 120 and the exposed package substrate 510 in FIG. 5.

In an embodiment, each device represented may be present, or a subset of what is illustrated may be present.

The through-mold via package bottom interposer 820 includes an array of bond pads, one of which is indicated by reference number 815. A device array is disposed in part on the land side 113 that is analogous to the land side 113 of the respective package substrates 410 and 510 depicted in FIGS. 4 and 5, or in part in a recess 813 that is analogous to the recesses 413 and 513 depicted respectively in FIGS. 4 and 5.

Referring to FIG. 4, it is observed that two passive devices 450 and 154 are suspended from the infield of the through-mold via package bottom interposer on the land side 113 and in the recess 413, and these devices are seen suspended therefrom. Additionally a MORP 452 is also suspended from the package substrate 410 in the recess 413.

Referring to FIG. 5, it is observed that a passive device 154 is suspended from the infield of the through-mold via package bottom interposer 120 on the land side 113 of the package substrate 510, a passive device 552 is suspended from the recess 513, and a SMORP is also suspended from the land side recess 513.

Figure 9:
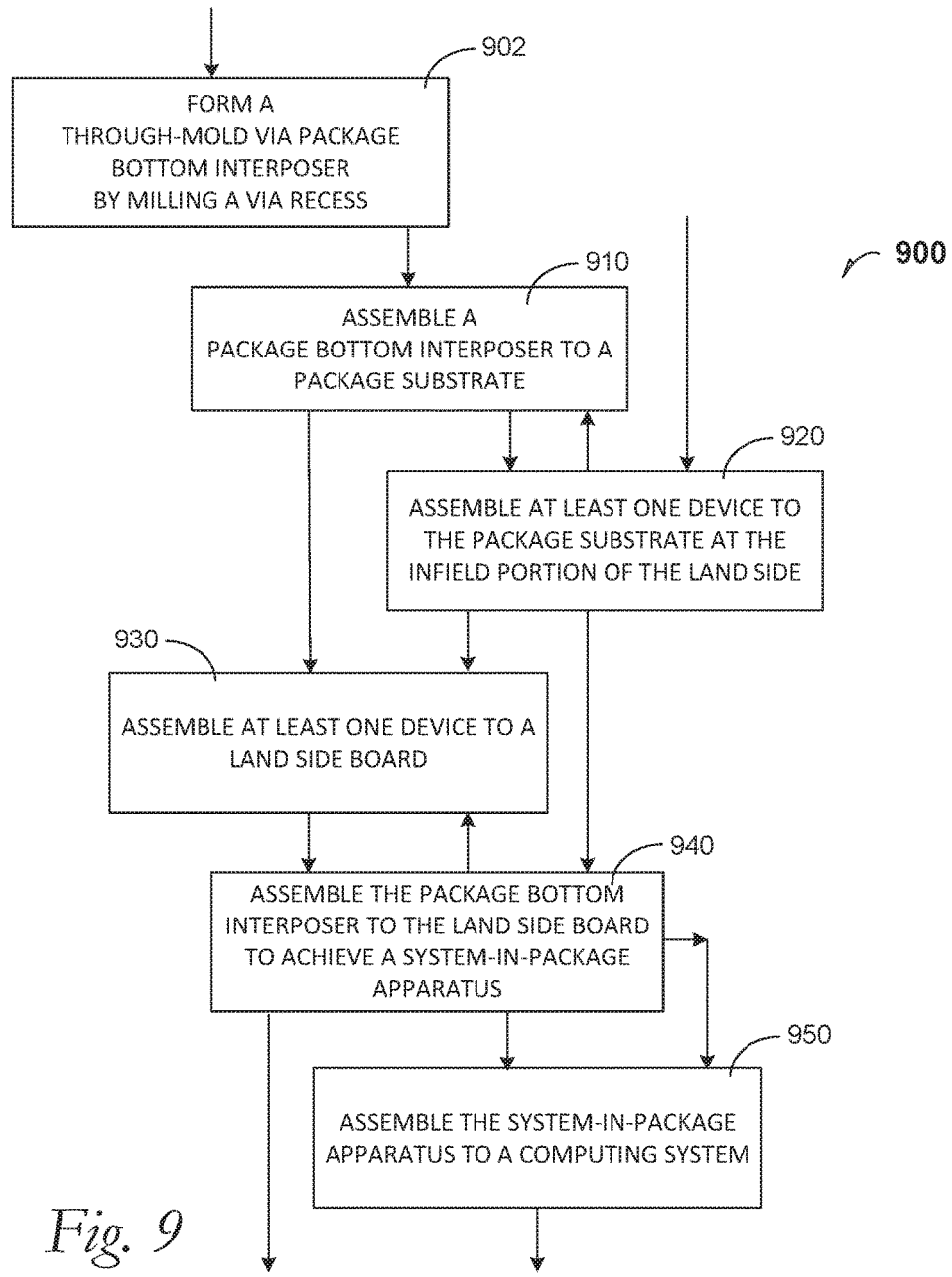
FIG. 9 is a process flow diagram according to an embodiment.

FIG. 9 is a process flow diagram 900 according to an embodiment.

At 902, the process includes forming a through-mold via package bottom interposer by milling a via recess. By way of non-limiting example embodiment, a laser is used to mill a frusto-conical via in the package bottom interposer 120, followed by plating electrically conductive via material.

At 910, the process includes assembling a through-mold via package bottom interposer to a package substrate. By way of non-limiting example, the through-mold via package bottom interposer 120 is assembled to the package substrate 110 depicted in FIG. 1.

At 920, the process may commence and flow to 910. At 920, the process includes assembling at least one device to the package substrate at the infield portion of the land side. By way of non-limiting example, at least one device 150 depicted in FIG. 1 is assembled to the package substrate 110 at the infield portion of the land side 113. In an embodiment, the process may flow from 920 to 940.

At 930, the process includes assembling at least one device to a land side board. By way of non-limiting example, the device 356 is assembled to the land side board 140 as illustrate in FIG. 3.

At 940, the process may continue from 920. At 940, the process includes assembling the through-mold via package bottom interposer to the land side board to achieve a system-in-package apparatus. By way of non-limiting example, the through-mold via package bottom interposer 120 is assembled to the land side board 140 as depicted FIG. 5.

At 950, the process includes assembling the system-in-package apparatus into a computing system. Example embodiments are set forth with respect to FIG. 10.

Figure 10:
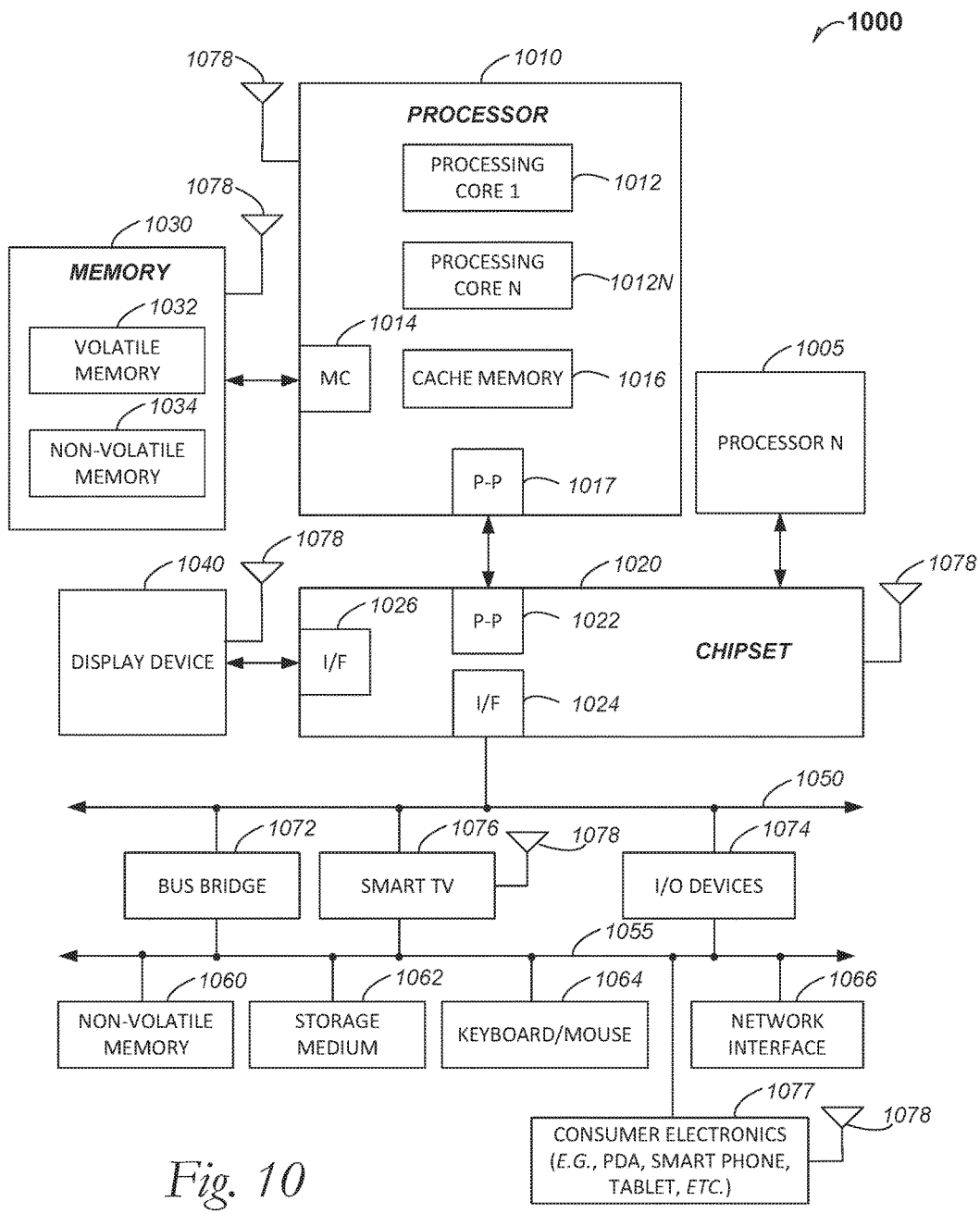
FIG. 10 is a computing system according to an embodiment.

FIG. 10 is a computing system 1000 according to an embodiment. FIG. 10 illustrates a system level diagram, according to one embodiment of the invention. For instance, FIG. 10 depicts an example of a microelectronic device that includes a system-in-package apparatus with a through-mold via package bottom interposer embodiment as described in the present disclosure.

FIG. 10 is included to show an example of a higher level device application for the disclosed embodiments. In one embodiment, a system 1000 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the system-in-package apparatus with a through-mold via package bottom interposer embodiment 1000 is a system on a chip (SOC) system.

In an embodiment, the processor 1010 has one or more processing cores 1012 and 1012N, where 1012N represents the Nth processor core inside processor 1010 where N is a positive integer. In an embodiment, the electronic device system 1000 using a system-in-package apparatus with a through-mold via package bottom interposer embodiment that includes multiple processors including 1010 and 1005, where the processor 1005 has logic similar or identical to the logic of the processor 1010. In an embodiment, the processing core 1012 includes, but is not limited to, pre-fetch logic to fetch instructions, decode logic to decode the instructions, execution logic to execute instructions and the like. In an embodiment, the processor 1010 has a cache memory 1016 to cache at least one of instructions and data for the SiP device system 1000. The cache memory 1016 may be organized into a hierarchal structure including one or more levels of cache memory.

In an embodiment, the processor 1010 includes a memory controller 1014, which is operable to perform functions that enable the processor 1010 to access and communicate with memory 1030 that includes at least one of a volatile memory 1032 and a non-volatile memory 1034. In an embodiment, the processor 1010 is coupled with memory 1030 and chipset 1020. The processor 1010 may also be coupled to a wireless antenna 1078 to communicate with any device configured to at least one of transmit and receive wireless signals. In an embodiment, the wireless antenna interface 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1034 includes, but is not limited to, flash memory, phase change memory (PCM), read-only memory (ROM), electrically erasable programmable read-only memory (EEPROM), or any other type of non-volatile memory device.

The memory 1030 stores information and instructions to be executed by the processor 1010. In an embodiment, the memory 1030 may also store temporary variables or other intermediate information while the processor 1010 is executing instructions. In the illustrated embodiment, the chipset 1020 connects with processor 1010 via Point-to-Point (PtP or P-P) interfaces 1017 and 1022. Either of these PtP embodiments may be achieved using a system-in-package apparatus with a through-mold via package bottom interposer embodiment as set forth in this disclosure. The chipset 1020 enables the processor 1010 to connect to other elements in the SiP device system 1000. In an embodiment, interfaces 1017 and 1022 operate in accordance with a PtP communication protocol such as the Intel® QuickPath Interconnect (QPI) or the like. In other embodiments, a different interconnect may be used.

In an embodiment, the chipset 1020 is operable to communicate with the processor 1010, 1005N, the display device 1040, and other devices 1072, 1076, 1074, 1060, 1062, 1064, 1066, 1077, etc. The chipset 1020 may also be coupled to a wireless antenna 1078 to communicate with any device configured to at least do one of transmit and receive wireless signals.

The chipset 1020 connects to the display device 1040 via the interface 1026. The display 1040 may be, for example, a liquid crystal display (LCD), a plasma display, cathode ray tube (CRT) display, or any other form of visual display device. In and embodiment, the processor 1010 and the chipset 1020 are merged into a single SOC. Additionally, the chipset 1020 connects to one or more buses 1050 and 1055 that interconnect various elements 1074, 1060, 1062, 1064, and 1066. Buses 1050 and 755 may be interconnected together via a bus bridge 1072. In an embodiment, the chipset 1020 couples with a non-volatile memory 1060, a mass storage device(s) 1062, a keyboard/mouse 1064, and a network interface 1066 by way of at least one of the interface 1024 and 1074, the smart TV 1076, and the consumer electronics 1077, etc.

In and embodiment, the mass storage device 1062 includes, but is not limited to, a solid state drive, a hard disk drive, a universal serial bus flash memory drive, or any other form of computer data storage medium. In one embodiment, network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the SiP apparatus in a computing system 1000, the functions performed by some of these blocks may be integrated within a single semiconductor circuit or may be implemented using two or more separate integrated circuits. For example, although cache memory 1016 is depicted as a separate block within processor 1010, cache memory 1016 (or selected aspects of 1016) can be incorporated into the processor core 1012. Where useful, the computing system 1000 may have an outer shell that is part of the several land side board embodiments described in this disclosure. For example, the land side board 140 depicted in FIG. 1, has an outer surface 142 that is sufficiently insulated that it may act as an outer shell of the computing system 1000 depicted in FIG. 10. This embodiment may be seen in each of the cross-section elevations including an outer surface 642 for the system-in-package apparatus with a through-mold via package bottom interposer embodiment depicted in FIG. 6.

To illustrate the system-in-package apparatus with a through-mold via package bottom interposer embodiment and methods disclosed herein, a non-limiting list of examples is provided herein:

Example 1 is a system-in-package apparatus comprising: a package substrate configured to carry at least one semiconductive device on a die side; a through-mold via package bottom interposer disposed on the package substrate on a land side, wherein the through-mold via package bottom interposer includes at least one through-mold via; a land side board onto which the through-mold via package bottom interposer is mounted, wherein a bump is disposed on the land side board and couples the through-mold via with a bond pad there between; and at least one device disposed on the package substrate on the land side; and wherein the at least one through-mold via couples the package substrate and the land side board by a lateral connection.

In Example 2, the subject matter of Example 1 optionally includes wherein package substrate is above and on the at least one through-mold via.

In Example 3, the subject matter of any one or more of Examples 1-2 optionally include wherein the including at least one fully integrated voltage regulator (FiVR) integrated in the package substrate, wherein the FiVR is disposed below at least one semiconductive device, wherein the at least one semiconductive device is a processor.

In Example 4, the subject matter of any one or more of Examples 1-3 optionally include at least one fully integrated voltage regulator (FiVR) integrated in the package substrate, wherein the FiVR is disposed below at least one semiconductive device, wherein the at least one semiconductive device is a processor, and wherein the FiVR is located directly below circuitry to facilitate voltage-regulation demand.

In Example 5, the subject matter of any one or more of Examples 1-4 optionally include at least one fully integrated voltage regulator (FiVR) integrated in the package substrate, wherein the FiVR is disposed below at least one semiconductive device, wherein the at least one semiconductive device is a processor, wherein the FiVR is located directly below circuitry to facilitate voltage-regulation demand, and wherein the FiVR is disposed vertically from a promixate through-mold via.

In Example 6, the subject matter of any one or more of Examples 1-5 optionally include a bump array disposed between the through-mold via package bottom interposer and the land side board, wherein the bump array creates a first vertical distance between the through-mold via package bottom interposer and the land side board, wherein the through-mold via package bottom interposer creates a second vertical distance between the bump array and the land side, and wherein second vertical distance is greater than the first vertical distance.

In Example 7, the subject matter of any one or more of Examples 1-6 optionally include a bump array disposed between the through-mold via package bottom interposer and the land side board, wherein the bump array creates a first vertical distance between the through-mold via package bottom interposer and the land side board, wherein the through-mold via package bottom interposer creates a second vertical distance between the bump array and the land side, wherein second vertical distance is greater than the first vertical distance, and wherein the bump array is spaced apart center-to-center with a third distance of least four bumps spacing that is less than the second distance.

In Example 8, the subject matter of Example 7 optionally includes wherein one device disposed on the land side is an active device and one device disposed on the land side is a passive device.

In Example 9, the subject matter of any one or more of Examples 1-8 optionally include wherein the at least one semiconductive device includes a processor and a platform-controller hub, further including: at least one fully integrated voltage regulator (FiVR) integrated in the package substrate, wherein the FiVR is disposed below the processor.

In Example 10, the subject matter of any one or more of Examples 1-9 optionally include wherein the at least one device is a suspended device that is disposed above the land side board, and further including a least one landed device disposed on the land side board.

In Example 11, the subject matter of Example 10 optionally includes wherein one device disposed on the land side is an active device and one device disposed on the land side is a passive device.

In Example 12, the subject matter of any one or more of Examples 1-11 optionally include wherein the package substrate includes a recess that opens the land side, further including at least one device disposed in the recess.

In Example 13, the subject matter of any one or more of Examples 1-12 optionally include a bump array disposed between the through-mold via package bottom interposer and the land side board; a recess that opens the land side board to a level below the bump array; and at least one device disposed in the recess.

In Example 14, the subject matter of any one or more of Examples 1-13 optionally include a bump array disposed between the through-mold via package bottom interposer and the land side board; a recess that opens the land side board to a level below the bump array, and at least one device disposed in the recess, wherein the at least one device has a profile that extends above at least the bump array where the bump array contacts the land side board.

In Example 15, the subject matter of Example 14 optionally includes wherein one device disposed on the land side is an active device and one device disposed on the land side is a passive device.

Example 16 is a process of assembling a system-in-package apparatus with a through-mold via package bottom interposer, comprising: assembling a through-mold via package bottom interposer to a package substrate, wherein the package; assembling at least one device to the package substrate at an infield that is formed by the through-mold via package bottom interposer; and assembling the through-mold via package bottom interposer to a land side board by a bump array, wherein the bump array has a first vertical distance, the through-mold via package bottom interposer has a second vertical distance, and wherein the at least one device has a profile that is greater than the second vertical distance.

In Example 17, the subject matter of Example 16 optionally includes assembling at least one device to the land side board.

In Example 18, the subject matter of Example 17 optionally includes wherein assembling the at least one device includes assembling a memory die.

In Example 19, the subject matter of any one or more of Examples 17-18 optionally include wherein assembling the at least one device includes assembling a baseband processor.

In Example 20, the subject matter of any one or more of Examples 17-19 optionally include wherein assembling the at least one device includes assembling a stack of memory dice.

Example 21 is a computing system including a system-in-package apparatus comprising: a package substrate configured to carry at least one semiconductive device on a die side; a through-mold via package bottom interposer disposed on the package substrate on a land side, wherein the through-mold via package bottom interposer includes at least one through-mold via; a land side board onto which the through-mold via package bottom interposer is mounted; and at least one device disposed on the package substrate on the land side; wherein the at least one through-mold via couples the package substrate and the land side board by a lateral connection; and a shell attached to the land side board.

In Example 22, the subject matter of Example 21 optionally includes wherein the at least one device includes a memory die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system-in-package apparatus comprising:
a package substrate configured to carry at least one semiconductive device on a die side;
a through-mold via package bottom interposer disposed on the package substrate on a land side, wherein the through-mold via package bottom interposer includes at least one through-mold via;
a land side hoard onto which the through-mold via package bottom interposer is mounted, wherein a hump is disposed on the land side board and couples the through-mold via with a bond pad there between;
at least one device disposed on the package substrate on the land side; and
wherein the at least one through-mold via couples the package substrate and the land side board by a lateral connection, and
a bump array disposed between the through-mold via package bottom interposer and the land side board, wherein the bump array creates a first vertical distance between the through-mold via package bottom interposer and the land side board, wherein the through-mold via package bottom interposer creates a second vertical distance between the bump array and the land side, and wherein second vertical distance is greater than the first vertical distance.

2. The system-in-package apparatus of claim 1, wherein package substrate is above and on the at least one through-mold via.

3. The system-in-package apparatus of claim 1, further including at least one fully integrated voltage regulator (FiVR) integrated in the package substrate, wherein the FiVR is disposed below at least one semiconductive device, wherein the at least one semiconductive device is a processor.

4. The system-in-package apparatus of claim 1, further including at least one fully integrated voltage regulator (FiVR) integrated in the package substrate, wherein the FiVR is disposed below at least one semiconductive device, wherein the at least one semiconductive device is a processor, and wherein the FiVR is located directly below circuitry to facilitate voltage-regulation demand.

5. The system-in-package apparatus of claim 1, further including at least one fully integrated voltage regulator (FiVR) integrated in the package substrate, wherein the FiVR is disposed below at least one semiconductive device, wherein the at least one semiconductive device is a processor, wherein the FiVR is located directly below circuitry to facilitate voltage-regulation demand, and wherein the FiVR is disposed vertically from a promixate through-mold via.

6. The system-in-package apparatus of claim 1, wherein the at least one semiconductive device includes a processor and a platform-controller hub, further including:
at least one fully integrated voltage regulator (FiVR) integrated in the package substrate, wherein the FiVR is disposed below the processor.

7. The system-in-package apparatus of claim 1, wherein the at least one device is a suspended device that is disposed above the land side hoard, and further including a least one landed device disposed on the land side board.

8. The system-in-package apparatus of claim 7, wherein one device disposed on the land side is an active device and one device disposed on the land side is a passive device.

9. The system-in-package apparatus of claim 1, wherein the package substrate includes a recess that opens the land side, further including at least one device disposed in the recess.

10. The system-in-package apparatus of claim 1, further including:
a recess that opens the land side board to a level below the bump array; and
at least one device disposed in the recess.

11. The system-in-package apparatus of claim 1, further including:
a recess that opens the land side board to a level below the bump array; and
at least one device disposed in the recess, wherein the at least one device has a profile that extends above at least the bump array where the bump array contacts the land side board.

12. The system-in-package apparatus of claim 11, wherein one device disposed on the land side is an active device and one device disposed on the land side is a passive device.

13. A system-in-package apparatus comprising:
a package substrate configured to carry at least one semiconductive device on a die side;
a through-mold via package bottom interposer disposed on the package substrate on a land side, wherein the through-mold via package bottom interposer includes at least one through-mold via;
a land side board onto which the through-mold via package bottom interposer is mounted, wherein a bump is disposed on the land side board and couples the through-mold via with a bond pad there between;
at least one device disposed on the package substrate on the land side; and
wherein the at least one through-mold via couples the package substrate and the land side board by a lateral connection; and
a bump array disposed between the through-mold via package bottom interposer and the land side board, wherein the bump array creates a first vertical distance between the through-mold via package bottom interposer and the land side hoard, wherein the through-mold via package bottom interposer creates a second vertical distance between the bump array and the land side, wherein second vertical distance is greater than the first vertical distance, and wherein the hump array is spaced apart center-to-center with a third distance of least four bumps spacing that is less than the second distance.

14. The system-in-package apparatus of claim 13, wherein one device disposed on the land side is an active device and one device disposed on the land side is a passive device.

15. A process of assembling a system-in-package apparatus with a through-mold via package bottom interposer, comprising:
assembling a through-mold via package bottom interposer to a package substrate;
assembling at least one device to the package substrate at an infield that is formed by the through-mold via package bottom interposer; and
assembling the through-mold via package bottom interposer to a land side board by a bump array, wherein the bump array has a first vertical distance, the through-mold via package bottom interposer has a second vertical distance, and wherein the at least one device has a profile that is greater than the second vertical distance.

16. The process of claim 15, further including:
assembling at least one device to the land side board.

17. The process of claim 15, wherein assembling the at least one includes assembling a memory die.

18. The process of claim 16, wherein assembling the at least one device includes assembling a baseband processor.

19. The process of claim 16, wherein assembling the at least one device; includes assembling a stack of memory dice.

* * * * *

UNITED STATES PATENT AND TRADEMARK OFFICE
CERTIFICATE OF CORRECTION

PATENT NO. : 10,153,253 B2  
APPLICATION NO. : 15/357233  
DATED : December 11, 2018  
INVENTOR(S) : Loo et al.

Page 1 of 1

It is certified that error appears in the above-identified patent and that said Letters Patent is hereby corrected as shown below:

In the Claims

In Column 13, Line 39, in Claim 1, delete "hoard" and insert --board-- therefor

In Column 13, Line 40, in Claim 1, delete "hump" and insert --bump-- therefor

In Column 14, Line 22, in Claim 7, delete "hoard," and insert --board,-- therefor In Column 14, Line 67, in Claim 13, delete "hoard," and insert --board,-- therefor In Column 15, Line 4, in Claim 13, delete "hump" and insert --bump-- therefor In Column 16, Line 10, in Claim 17, delete "claim 15," and insert --claim 16,-- therefor In Column 16, Line 11, in Claim 17, after "one", insert --device--

In Column 16, Line 16, in Claim 19, delete "device;" and insert --device-- therefor Signed and Sealed this  
Twenty-eighth Day of April, 2020

Andrei Iancu  
*Director of the United States Patent and Trademark Office*